(12) United States Patent
Tanda et al.

(10) Patent No.: US 7,888,869 B2
(45) Date of Patent: Feb. 15, 2011

(54) LIGHT EMITTING DEVICE

(75) Inventors: Yuichiro Tanda, Shinjuku-ku (JP); Hiroto Tamaki, Anan (JP)

(73) Assignee: Nichia Corporation, Anan-shi (JP)

( * ) Notice: Subject to any disclaimer, the term of this patent is extended or adjusted under 35 U.S.C. 154(b) by 442 days.

(21) Appl. No.: 11/600,869

(22) Filed: Nov. 17, 2006

(65) Prior Publication Data

US 2007/0126356 A1 Jun. 7, 2007

(30) Foreign Application Priority Data

Dec. 2, 2005 (JP) ............................. 2005-349709

(51) Int. Cl.
*H01J 1/62* (2006.01)
(52) U.S. Cl. ........................................... 313/512
(58) Field of Classification Search .............. 313/494, 313/498, 506, 507, 509, 512; 257/98–100
See application file for complete search history.

(56) References Cited

U.S. PATENT DOCUMENTS 7,125,798 B2 * 10/2006 Sakamoto et al. ........... 438/666
7,491,981 B2 * 2/2009 Yamaguchi et al. ......... 257/100
2003/0107316 A1 * 6/2003 Murakami et al. .......... 313/512
2004/0169466 A1 * 9/2004 Suehiro et al. ............. 313/512
2005/0072981 A1 * 4/2005 Suenaga ...................... 257/88
2005/0161771 A1 * 7/2005 Suehiro et al. ............. 257/612

FOREIGN PATENT DOCUMENTS

| JP | H11-045961 A | 2/1999 |
|----|----|----|
| JP | H11-195733 A | 7/1999 |
| JP | 2001-203396 A | 7/2001 |
| JP | 2001-217353 A | 8/2001 |
| JP | 2002-009196 A | 1/2002 |
| JP | 2003-174121 A | 6/2003 |
| JP | 2004-214265 A | 7/2004 |
| JP | 2004214265 | * 7/2004 |

* cited by examiner

*Primary Examiner*—Joseph L Williams
*Assistant Examiner*—Brenitra M Lee
(74) *Attorney, Agent, or Firm*—Global IP Counselors, LLP

(57) ABSTRACT

A light emitting device, comprises a light emitting element, a plurality of electroconductive layers on which said light emitting element is mounted or which are electrically connected to the light emitting element, and a translucent insulating member that seals the light emitting element and has the electroconductive layers as its bottom surface, wherein the electroconductive layers have a protrusion on part of their side faces, and the upper edges of the protrusion is rounded off.

10 Claims, 4 Drawing Sheets

LIGHT EMITTING DEVICE

BACKGROUND OF THE INVENTION

1. Field of the Invention

The present invention relates to a light emitting device, and more particularly relates to a light emitting device that is used in lighting, automobiles, industrial devices, and consumer devices (such as displays), and can be used to advantage in thin and compact surface mounting applications, and to a method for manufacturing this light emitting device.

2. Background Information

An example of a conventional surface mount type of light emitting device is a light emitting device in which a light emitting element is electrically connected to a pair of electroconductive members formed in a pattern on the surface of an insulating substrate made of glass epoxy, ceramic, or the like, and the area near the light emitting element is sealed with a translucent insulating member.

A light emitting device such as this is expensive to manufacture because it entails so many manufacturing steps and parts. Furthermore, heat generated by the light emitting element is radiated to the outside through the substrate, which is composed of an insulating material with low thermal conductivity, so heat dissipation is inadequate. As a result, when a high-output light emitting element is used, the device cannot be used in applications where continuous use is desirable. The heat dissipation path can be shortened by making the insulating substrate thinner, but if this is done the electroconductive member formed on the upper face may not be strong enough.

Thus, it has been difficult to increase the heat dissipation of a light emitting device and at the same time keep the device thin and compact.

Meanwhile, a light emitting device has been proposed that does not have the above-mentioned substrate, and in which a pair of electrodes are affixed to the bottom face of the translucent resin that seals the light emitting element, etc. (Japanese Laid-Open Patent Application 2001-203396).

However, the side faces of the electrodes embedded in the resin are substantially parallel to the embedding direction, so impact and so forth encountered during mounting to a circuit board or during use after mounting can easily cause the electrodes to separate from the resin, resulting in a less integral structure in the light emitting device. Particularly in the case of a light emitting device, since the insulating member that seals the light emitting element has to be made translucent, the mechanical strength cannot be increased by adding a filler or the like, making it extremely likely that this problem will occur.

Moreover, no specific method for manufacturing this light emitting device has been described.

SUMMARY OF THE INVENTION

It is an object of the present invention to provide a highly reliable light emitting device that is thin and compact, and a method for manufacturing this device.

The present invention provides a light emitting device, comprising a light emitting element, a plurality of electroconductive layers on which said light emitting element is mounted or which are electrically connected to the light emitting element, and a translucent insulating member that seals the light emitting element and has the electroconductive layers as its bottom surface, wherein the electroconductive layers have a protrusion on part of their side faces, and the upper edges of the protrusion is rounded off.

Further, the present invention provides a method for manufacturing a light emitting device comprising light emitting element, a plurality of electroconductive layers on which said light emitting element is mounted or which are electrically connected to the light emitting element, and a translucent insulating member that seals the light emitting element and has the electroconductive layers as its bottom surface, comprising coating a resist on the upper face of a metal matrix material, and removing part of the resist to form an opening; adhering electroconductive particles within the opening to form an electroconductive layer, as well as adhering the electroconductive particles from inside the opening to the upper face of the resist, to form protrusions on part of the lateral faces of the electroconductive layer; removing the resist, and then placing a light emitting element on the upper face of the electroconductive layer, connecting electrically, and covering with a translucent insulating member; and stripping the metal matrix material from the bottom face of the electroconductive layer and the bottom face of the translucent insulating member.

The light emitting device of the present invention can be utilized as a light emitting device equipped with a light emitting diode, semiconductor laser, or other such light emitting element in various kinds of indicator, light sensor, display, photocoupler, backlight light source, optical printer head, and so on.

BRIEF DESCRIPTION OF THE DRAWINGS

FIG. 1b is a simplified cross section along the A-A line in FIG. 1a.

FIG. 2b is a simplified cross section along the A-A line in FIG. 2a.

FIG. 3b is a simplified cross section along the A-A line in FIG. 3a.

FIG. 4b is a simplified cross section along the A-A line in FIG. 4a.

DESCRIPTION OF THE PREFERRED EMBODIMENTS

Figure 1A:
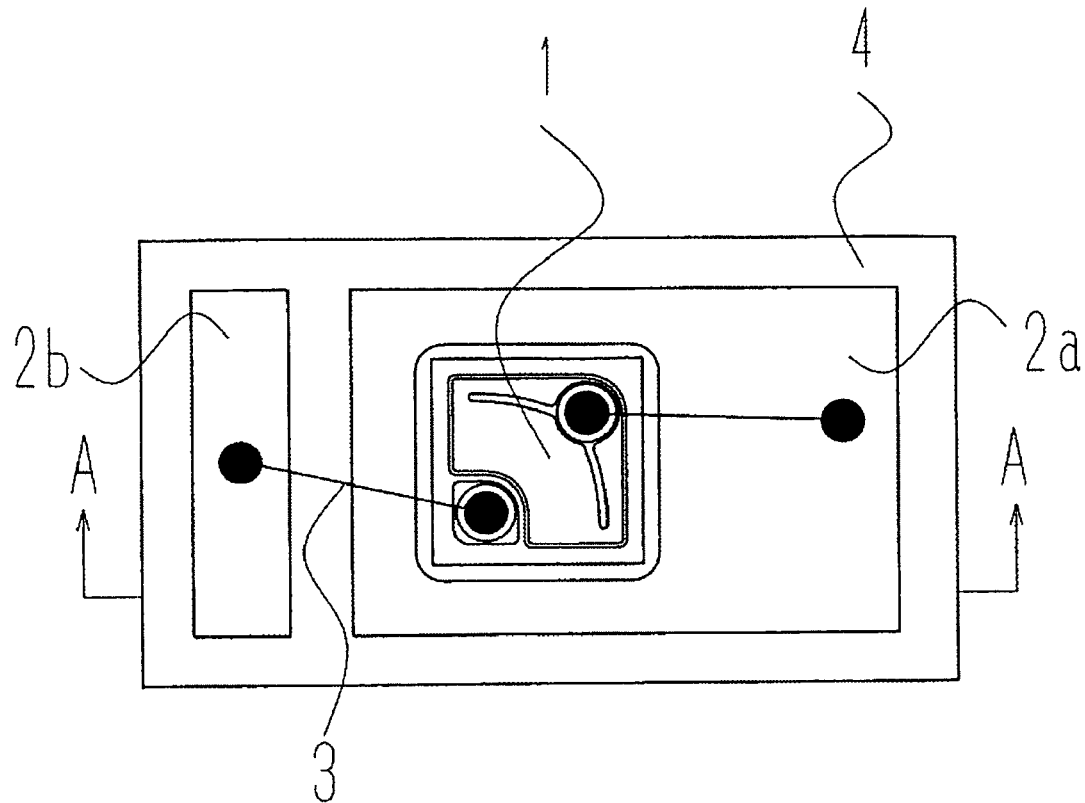
FIG. 1a is a simplified plan view of the light emitting device in an embodiment.

The best mode for carrying out the present invention will now be described through reference to the drawings. The modes discussed below, however, are merely examples of a light emitting device for embodying the technological concept of the present invention, and the present invention is not limited to the light emitting devices discussed below. Also, this Specification in no way specifies that the members given in the Claims are the members in the embodiments. Unless otherwise specified, the dimensions, material, shape, relative disposition, and so forth of the constitution parts discussed in the embodiments are nothing but examples, and do not serve to limit the scope of the present invention to just those given. Furthermore, the size, positional relationship, and so forth of the members illustrated in the drawings may be exaggerated to make the description easier to understand. In the description that follows, members that have the same name or symbol indicate the same or equivalent members, and their detailed description may be omitted as needed. Further, the elements that constitute the present invention may be in a mode in which a plurality of elements are constituted by a single member, so that a single member shares a plurality of elements, or the functions of a single member may be allocated to a plurality of members.

Figure 1B:
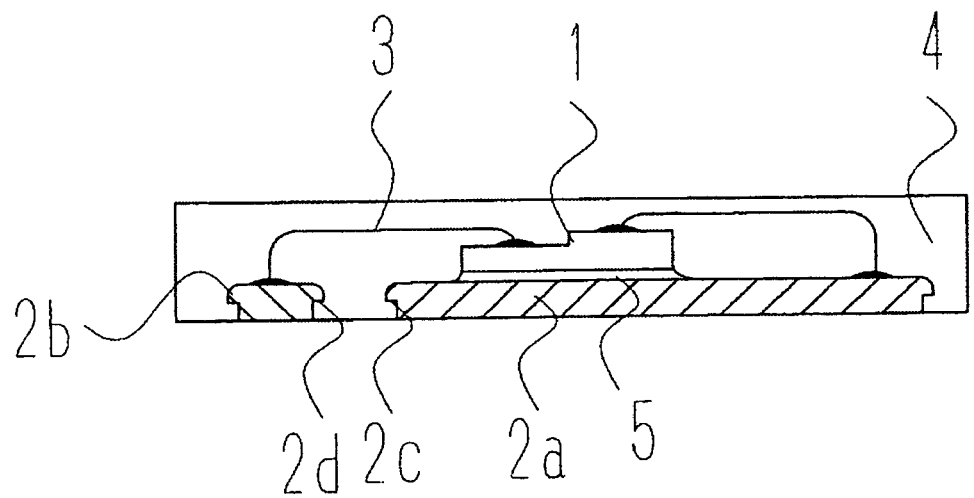

As shown in FIGS. 1a and 1b, the light emitting device of the present invention has a light emitting element 1, a first electroconductive layer 2a on which the light emitting element 1 is mounted and which is electrically connected by a wire 3 to one of the electrodes of the light emitting element 1, a second electroconductive layer 2b that is electrically connected by the wire 3 to the other electrode of the light emitting element 1, and a translucent insulating member 4 that seals these components. The first electroconductive layer 2a and the second electroconductive layer 2b are disposed apart from each other on the bottom face of the translucent insulating member 4. The first electroconductive layer 2a and second electroconductive layer 2b have protrusions 2c and 2d, respectively, on their side faces.

Light Emitting Element

The light emitting element 1 in this embodiment can be the light source for a light emitting device, such as a light emitting diode or a laser diode. Also, with the light emitting device in this embodiment, light receiving elements, and protective elements (such as Zener diodes or capacitors) that protect the semiconductor elements of these light receiving elements from breakdown due to over-voltage, or a combination of these, can be mounted along with the light emitting element 1.

An LED chip will be described as an example of the light emitting element 1. ZnSe, GaN, and various other such semiconductors can be used as the semiconductor light emitting element that constitutes the LED chip, but when the light emitting device has a fluorescent substance, it is preferable to use a nitride semiconductor ($In_XAl_YGa_{1-X-Y}N$, $0 \leqq X$, $0 \leqq Y$, $X+Y \leqq 1$) capable of emitting light with a short wavelength that can efficiently excite this fluorescent substance. The emission wavelength can be variously selected according to the material of the semiconductor layer or the degree of mixed crystals thereof. For instance, an LED chip can be a light emitting element that outputs not only light in the visible band, but also infrared or ultraviolet rays.

The light emitting element 1 used in the light emitting device in this embodiment is one that has a pair of positive and negative electrodes on the same side face, but the present invention is not limited to this, and a configuration in which the positive and negative electrodes are located on opposite sides can also be applied.

Electroconductive Layer

There are no particular restrictions on the material of which the plurality of electroconductive layers 2a and 2b used in this embodiment are made, as long as they are made of a material with good electroconductivity, heat dissipation, and adhesion to the translucent insulating member.

In particular, with a thin, compact light emitting device, since strength is required during joining with a circuit board, the hardness of the electroconductive layers is preferably from 450 to 550 Hv. The thermal conductivity of the electroconductive layers is preferably at least 0.01 cal/(S) (cm$^2$) (° C./cm), more preferably at least 0.5 cal/(S) (cm$^2$) (° C./cm). The electrical resistance is preferably 300 $\mu\Omega$·cm or less, more preferably 3 $\mu\Omega$·cm or less.

Specific examples of the material used to form these electroconductive layers include a plating layer composed of a metal with a high melting point, such as Cu, Au, Ni, W, Mo, Mn or Ta, or microparticles thereof. Of these metals with a high melting point, nickel is particularly favorable compared to other metals because it has superior physical properties, such as high tensile strength, a high elastic modulus, high strength at high temperatures, and a relatively small coefficient of thermal expansion. These metals with a high melting point are suitable as materials for mounting a semiconductor light emitting element such as an LED or LD that generates a large amount of heat. It is also preferable to provide an electroconductive film with a gloss of at least 90 to the surface of the electroconductive layers, because this affords an electroconductive layer that also has a light reflecting function. The "gloss" referred to here is the value measured with a VSR 300A Micro Color Meter made by Nippon Denshoku Industries, where a gloss of zero is defined as that of a glass surface with a refractive index of 1.567 and a mirror reflectivity of 10% when light is incident at 60° from a light emitting element, based on the JIS standard. The light emitting device can also be one capable of emitting light over the entire surface, using ITO, IZO, or another such transparent electrode material.

Protrusion 2c and 2d

The electroconductive layers 2a and 2b in this embodiment have protrusions 2c and 2d on their side faces. This improves adhesion between the electroconductive layers 2a and 2b and the translucent insulating member 4. When a light emitting device mounted on a circuit substrate is subjected to an impact, the light emitting device cannot be kept in an integrated state merely by affixing the thin electroconductive layers to the back face of the translucent insulating member. It is also possible to increase adhesion to the translucent insulating member by etching or otherwise roughening the side faces of the electroconductive layers, but since a plurality of electroconductive layers are disposed apart from each other, if the opposing side faces of the electroconductive layers from the light emitting element are rough surfaces, there is a high probability that light hitting these rough surfaces will be confined in the insulating member of the intervening portion. Ways of increasing the mechanical strength of the translucent insulating member include adding a dispersant such as titanium oxide, zirconia oxide, aluminum oxide, or silicon oxide, or adding a thickener such as fumed silica or fumed aluminum, or a pigment or the like, but these have to be added in a large amount to obtain the desired strength, and these lower transparency. It has thus been difficult to maintain light takeoff efficiency while increasing the mechanical strength of the sealing member itself. In view of this, with the present invention, the integrity of the overall light emitting device is enhanced by giving the electroconductive layers that are in contact with (connected to) almost all of the basic constituent members of a light emitting device a shape that is favorable in terms of optical characteristics, and a shape that affords good adhesion.

The material of which the protrusions 2c and 2d are made can be selected from among materials that constitute the electroconductive layers, but does not necessarily have to be the same material as that of the above-mentioned electroconductive layers.

There are no particular restrictions on the shape of the protrusions 2c and 2d, but the edges are preferably rounded. This makes it possible to suppress the confinement of a light in the lower part of the electroconductive layers (protrusions), wherein the light is the reflection of light emitted from the light emitting element (such as light emitted from above the protrusions) by the side faces of the electroconductive layer. In other words, rounding the edges makes it easier for light emitted from the light emitting element to be reflected by the rounded protrusions toward the light exit surface (such as upward).

There are no particular restrictions on the size of the protrusions (the protruding length), but they preferably protrude from the electroconductive layers by about 5 µm or less in the side face direction on the upper face side of the electroconductive layers. This allows the electroconductive layers to be bonded securely and integrally to the back side of the translucent insulating member. Further, the size of the protrusions is not necessarily uniform, and may be wide and narrow in parts, or thick and thin in parts. The protrusions are preferably formed all the way around the electroconductive layers, but may be omitted somewhere. There are no particular restrictions on the location of the protrusions, but they are preferably on the upper face side of the electroconductive layers, as this reduces the loss of light in the intervening portion between the opposing electroconductive layers. Furthermore, the edges on the upper face side of the protrusions are preferably rounded off, and the side faces of the protrusions are preferably in radial form from the upper face to the bottom face. This allows a light emitting device with high luminosity to be obtained. The term "upper face" here refers to the face corresponding to the light takeoff direction of the light emitting device, and the face opposite from this upper face is called the "bottom face."

The thickness of the protrusions $2c$ and $2d$ is preferably from 10 to 70% of the total thickness of the electroconductive layers, more preferably from 30 to 60%, further preferably from 40 to 60%. The spacing between the protrusion $2c$ on the light emitting device interior side of the first electroconductive layer $2a$ and the protrusion $2d$ on the light emitting device interior side of the second electroconductive layer $2b$ that is adjacent to the first electroconductive layer $2a$ is preferably from 50 µm to 1 mm, and preferably from 50 to 300 µm and more preferably from 50 to 100 µm when productivity and light takeoff efficiency are taken into account.

As shown in FIGS. $3a$ and $3b$, a recess having a flat bottom face may be formed at one end of the first electroconductive layer $2a$, and the light emitting element 1 placed in this recess. The bottom face of the other end of the first electroconductive layer $2a$ is preferably convex so as to be located approximately parallel to the bottom face of the recess. The second electroconductive layer $2b$ preferably has one end that faces one end of the first electroconductive layer $2a$ at approximately the same upper face, and another end located at approximately the same upper face as the other end of the first electroconductive layer $2a$. A configuration such as this allows the mechanical strength of the light emitting device to be increased without reinforcing the rear face of the electroconductive layers with another member. Furthermore, since there are numerous mounting face support points, mounting precision is improved. Also, the electroconductive layers preferably have a substantially uniform thickness, as this will further improve mechanical strength.

Translucent Insulating Member 4 and Color Conversion Member 6

The light emitting device in this embodiment is such that the mounted light emitting element 1, the wire 3, and so forth are sealed by the translucent insulating member 4, the purpose of which is to protect them from dust, moisture, external force, and so forth, to integrate these members, and to increase the light takeoff efficiency of the light emitting element 1. The material of the translucent insulating member 4 can be selected from among epoxy resin, silicone resin, urea resin, and other such translucent resins, and glass and other such materials that tend to be translucent. The translucent insulating member 4 may also contain a fluorescent substance that emits light of a different wavelength upon absorbing at least some of the light from the light emitting element, and this can be the color conversion member 6. In this case, it is preferable to use as the translucent insulating member 4 a silicone resin or modified silicone resin that has excellent heat and light resistance, and that is resistant to coloration degradation when exposed to high-energy light of a short wavelength that includes UV rays, as this will suppress the occurrence of color unevenness and color drift. Also, even if solder or another such covering member undergoes repeated thermal expansion and thermal contraction, there will be less disconnection of the wire 3 connecting the light emitting element 1 to the electroconductive layers $2a$ and $2b$, less separation of a die bonding member 5, and so forth. Fluorescent substances that can be utilized in this embodiment are those that convert the light of the light emitting element, and it is more efficient if they convert the light from the light emitting element to a longer wavelength. If the light from the light emitting element is short-wavelength visible light with high energy, a $Ca_2Si_5N_8$ fluorescent material or a YAG:Ce fluorescent material, which is a kind of aluminum oxide-based fluorescent material, can be used favorably. In particular, depending on the amount in which it is contained, a YAG:Ce fluorescent material absorbs part of the blue light from an LED chip and emits yellow light that is a complementary color, so it is a relatively simple matter to form a high-output light emitting diode that emits white mixed light.

Die Bonding Member 5

In this embodiment, the light emitting element 1 is die-bonded to the upper face of the first electroconductive layer $2a$, which is in the approximate center of the light emitting device, and the electrodes of the light emitting element 1 are electrically connected by the wire 3 to the first electroconductive layer $2a$ and the second electroconductive layer $2b$.

The "die bonding member 5" in this embodiment is a member for fixing the light emitting element 1 and the electroconductive layer $2a$. Any die bonding member that has been used in the past, such as a thermosetting resin, for example, can be used, but specific examples include epoxy resins, acrylic resins, and imide resins. These resins can also contain a filler to adjust the coefficient of thermal expansion of the die bonding member 5. This suppresses separation of the light emitting element from the electroconductive layer $2a$. If the light emitting element 1 is die-bonded and electrically connected to the electroconductive layer $2a$, or if better heat dissipation is needed, it is preferable to use silver paste, carbon paste, ITO paste, a metal bump, or the like, and particularly in the case of a power type of light emitting device that generates a large amount of heat, it is preferable to use an Au—Sn-based eutectic material because its melting point is high enough that there will be little change in the textural structure under high temperature, and little deterioration in dynamic characteristics. However, when a member with high reflectivity to light from the light emitting element 1 is used as the die bonding member 5, light will be absorbed by the die bonding member 5, or light will be confined inside the light emitting element 1, so the percentage of the bottom face of the light emitting element 1 accounted for by the die bonding member 5 is preferably from 5 to 95%, more preferably from 20 to 70%, further preferably from 20 to 50%. Having the amount within this range affords better heat dissipation and easier mounting of the light emitting element 1, as well as higher light takeoff efficiency.

Wire 3

In this embodiment, the wire 3 that connects the electroconductive layers $2a$ and $2b$ with the electrodes of the light emitting element 1 must have good thermal conductivity, electrical conductivity, mechanical connectability, and ohmic properties with the electroconductive layers $2a$ and $2b$. The thermal conductivity is preferably at least 0.01 cal/(S)(cm$^2$)(° C./cm), more preferably at least 0.5 cal/(S)(cm$^2$)(° C./cm), and the diameter of the wire 3 is preferably from 10 to 45 μm when ease of work and so forth are taken into account. Specific examples of the wire material include conductive wires made from metals, such as Au, Cu, Pt, Al or the like and alloys thereof. In this embodiment, the wire is preferably bonded (bond stitch ball) to the electrodes of the light emitting element 1 from the electroconductive layers 2a and 2b side. This allows a low-super loop to be formed at a narrow pitch and high speed, which affords an ultra-thin, compact light emitting device. Also, since there is only one stress point in the wire, the resulting light emitting device has higher reliability.

Method for Manufacturing Light Emitting Device

First Step

With the light emitting device of this embodiment, the constituent members are all formed using a metal matrix material as a backing material. This affords a light emitting device that is thinner and has higher precision.

"Metal matrix material" is a foil that is applied to the thin electroconductive layers, and serves to ensure rigidity for the light emitting device as a whole when the constituent members of the light emitting device, namely, the electroconductive layers, the light emitting element, and the translucent insulating member, are attached to the upper face of the metal matrix material. This metal matrix material is peeled off after the light emitting device has been completed. There are no particular restrictions on the metal matrix material that can be peeled off in this manner, but it is particularly favorable to use a metal that has a body-centered cubic structure, such as Fe, Mo, W, filament steal, or the like. This makes it easier to control the peeling of the electroconductive layers laminated to the upper face and the metal matrix material, and allows the light emitting device productivity to be increased. The thickness is suitable from about 1 μm to 30 μm.

This metal matrix material preferably has a release layer that allows the translucent insulating member 4 and the electroconductive layers 2a and 2b laminated on the upper surface to be peeled off. A metal intermediate layer can be used as this release layer. The metal intermediate layer is preferably made of a material that can function as a barrier in the etching step performed in the course of patterning a resist on the upper face. For example, a metal such as Cu, Ti, Ag, Sn, Ni, Zn or an alloy whose main component is such a metal can be used for the metal intermediate layer. Particularly with a material whose main component is titanium, it is preferable for hydrogen to be contained, as this makes the metal intermediate layer itself more brittle and more prone to falling apart, and gives it a suitable amount of peel strength. With a material whose main component is titanium, it is preferable for it to contain from 0.5 to 5 mass % hydrogen from the standpoint of achieving enough brittleness and uniform peel strength in the peeling of the electroconductive layers and the metal matrix material, and preventing the electroconductive layers from separating in the transport step or the step of attaching the various constituent members of the light emitting device. With a material whose main component is Zr, it is preferable for it to contain from 0.02 to 2.5 mass % hydrogen. The phrase "whose main component is" used here means that the material in question is contained in an amount of at least 50 mass %. The thickness of the metal intermediate layer is suitable from about 10 μm or less. The peel strength between the laminated electroconductive layers and the metal matrix material is preferably between 0.01 and 0.8 N/mm from the standpoint of preventing the partial separation of the electroconductive layers in the course of handling, such as in the etching step or transport step, and from the standpoint of preventing the formed electroconductive layers from not peeling away from the metal matrix material in the peeling step following the formation of the constituent members of the light emitting device.

A weak bonding layer is formed at the interface between the metal matrix material and the metal intermediate layer. This weak bonding layer is preferably an oxygen concentrated layer. An oxygen concentrated layer is generally fragile. Therefore, peel strength can be controlled by forming such an oxygen concentrated layer partially at the interface between the metal matrix material and the metal intermediate layer ahead of time. The phrase "oxygen concentrated layer" used here means that the layer contains higher oxygen content than a portion of the metal matrix material. The weak bonding layer or oxygen concentrated layer may be included as a layer at the interface between the metal matrix material and the metal intermediate layer, but may also be disposed partially, in spots. The thickness thereof is suitable from about 3 μm or less.

Openings corresponding to the desired upper face shape of the electroconductive layers are formed by patterning a resist over a peelable metal matrix material constituted as above. The side faces of the resist pattern are preferably substantially perpendicular to the metal matrix material. The pitch of the openings is adjusted according to the desired protruding length of the protrusions of the electroconductive layers of the light emitting device.

Second Step

Next, the electroconductive layers are formed by applying electroconductive particles over the metal matrix material inside the openings. The method for laminating the electroconductive particles here can be vacuum vapor deposition, sputtering, ion plating, electrodeposition, electroprecipitation, or the like. Vacuum vapor deposition and electrodeposition are particularly favorable because of they allow a film to be former faster. When electroconductive layers are formed as ultra-thin films, a good quality film can be obtained using sputtering, ion plating, or another such method. The resulting electroconductive layers can be flattened, worked or the like utilizing ordinary various methods such as sputtering, wet etching or the like before or after the removal of the resist pattern.

After this, the protrusions of the electroconductive layers are formed by applying electroconductive particles over from the inside of the openings to the upper face of the resist. The shape (thickness, protruding length, etc.) of the protrusions of the electroconductive layers 2a and 2b here can be adjusted by adjusting the amount in which the particles are applied.

The total thickness of the applied layer of electroconductive particles here is preferably from 1.3 to 2.5 times the thickness of the resist pattern, more . preferably from 1.5 to 2.3 times, further preferably from 1.8 to 2.0 times.

After electroconductive particles have been laminated in this way, the electroconductive layers 2a and 2b can be formed by removing the resist pattern utilizing an ordinary wet etching process using a resist stripper, for example.

The edges of the protrusions can be controlled by a method in which the film thickness in which the electroconductive layers are formed is controlled, or a method in which sputtering, wet etching, or any of various other methods is utilized for flattening, working, or the like after the removal of the resist pattern, for example.

Third Step

The light emitting element is placed on the upper face of the electroconductive layer and electrically connected, the translucent insulating member 4 is applied so as to cover these constituent members, and the coating is cured.

Forth Step

Just the metal matrix material is wound onto a roll, and the metal matrix material is separated from the electroconductive layers 2a and 2b and the translucent insulating member 4. Depending on the intended application, either the metal intermediate layer remaining on the bottom face of the light emitting device thus obtained is used as a reflecting member or bonding promoter, or the metal intermediate layer is removed by selective etching with an etching solution that will substantially not etch the electroconductive layers 2a and 2b and the translucent insulating member. In particular, when the electroconductive layers 2a and 2b are made of a material with high thermal conductivity, it is possible to remove the metal intermediate layer without excessively etching the electroconductive layers 2a and 2b.

The light emitting device and method for manufacturing said device of the present invention will now be described in detail through working examples.

EXAMPLE 1

Using strip-shaped SUS 430 with a thickness of 60 μm as the metal matrix material, an intermediate layer composed of titanium was formed on the upper face of this metal matrix material, and this product was heat treated in a hydrogen gas atmosphere.

Next, a resist was formed in a thickness of 70 μm, and the resist was patterned so that an opening measuring 0.5×0.2 mm and an opening measuring 0.5×1.0 mm were arranged in parallel at a pitch of 0.2 mm.

A gold/nickel layer was formed in the openings. The upper face of the nickel layer was formed lower than the upper face of the resist. The gold layer was then formed so as to be higher than the resist upper face. The gold layer (the topmost layer) was then silver plated.

Finally, the resist was removed to obtain electroconductive layers 2a and 2b having protrusions 2c and 2d with a thickness and protruding length of 50 μm each.

Then, a light emitting element 1 was electrically connected to the pair of electroconductive layers 2a and 2b. More specifically, a gallium nitride-based compound semiconductor having an emission peak wavelength of approximately 460 nm and having positive and negative electrodes on the same side was used as the light emitting element 1, and was fixed with a diebonding resin 5 over the first electroconductive layer 2a. Next, a gold bump was formed over the pair of electrodes of the light emitting element 1, after which wire bonding was performed from the first electroconductive layer 2a to the gold bump (BSOB).

A silicone resin 4 was then applied so as to cover these constituent members, and the coating was cured.

Just the metal matrix material was then wound onto a roll and separated from the electroconductive layers 2a and 2b and the silicone resin 4.

The light emitting device that was continuously obtained was diced at the silicone resin portion around the outer periphery of the protrusions of the electroconductive layers to obtain the light emitting device shown in FIG. 1.

The light emitting device obtained in this manner was ultra-thin and compact, measuring just 1.6×0.8×0.2 mm, and had excellent reliability.

EXAMPLE 2

Figure 2A:
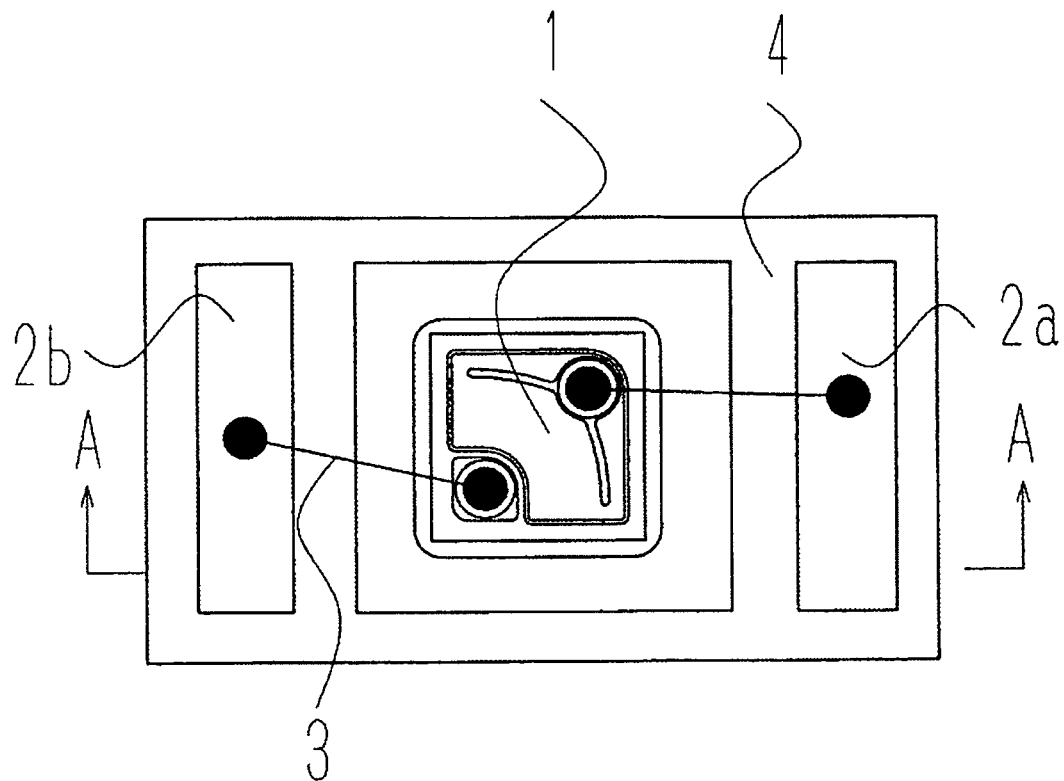
FIG. 2a is a simplified plan view of the light emitting device in an embodiment.
Figure 2B:
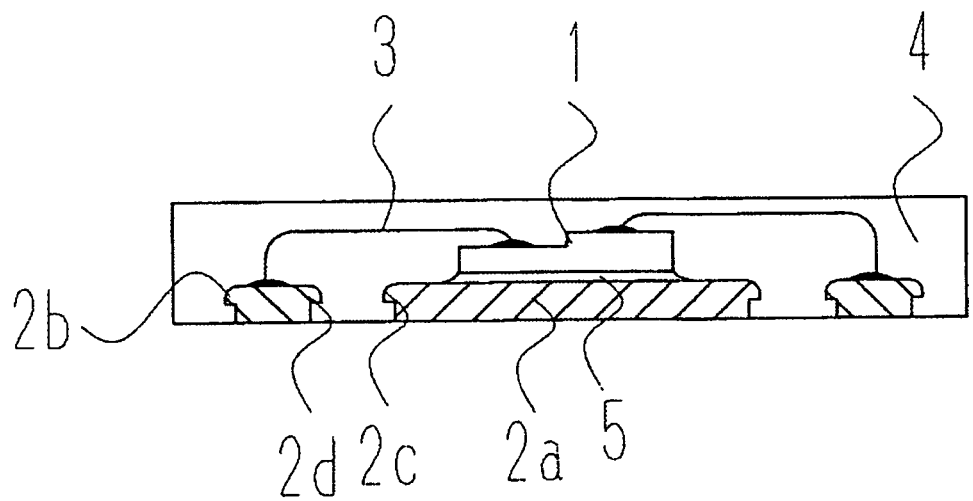

The light emitting device shown in FIGS. 2a and 2b was obtained in the same manner as in Example 1, except that the resist was patterned so that an opening measuring 0.5×0.2 mm, an opening measuring 0.5×1.0 mm, and an opening measuring 0.5×0.2 mm were arranged in parallel at a pitch of 0.2 mm, there were two electroconductive layers for wire bonding in one light emitting device, and there was one electroconductive layer for holding the light emitting element. The light emitting device obtained in this manner had better heat dissipation than the one in FIGS. 1a and 1b.

EXAMPLE 3

A plurality of recesses were formed to a depth of 80 μm by etching ahead of time in the metal matrix material, and an electroconductive layer 2a equipped with a recess capable of holding a light emitting element 1 was formed.

Next, the light emitting element 1 was placed in the above-mentioned recess, and the electrodes of the light emitting element 1 were electrically connected by wires 3 to the electroconductive layers 2a and 2b, after which the recess was filled with a color conversion member 6 containing a fluorescent substance capable of absorbing light from the light emitting element and converting it to a longer wavelength. More specifically, a silicone resin and a $(Y_{0.8}Gd_{0.2})_3Al_5O_{12}:Ce_{0.03}$ fluorescent substance were mixed in a weight ratio of 100:15 with stirring, and the recess was filled with the resulting mixture and left for 4 hours, allowing the fluorescent substance to settle. The fill amount is preferably enough to produce a shape that will protrude in the center. This is because it enhances light convergence. The silicone resin was cured for 3 hours at 50° C., for 1 hour while the temperature was raised to 150° C., and then for 4 hours at 150° C., to form the color conversion member 6.

Next, a translucent insulating member 4 was formed in a shape that allowed light from the light emitting element 1 to be converged. More specifically, it can be formed by press-bond molding or transfer molding.

Figure 3A:
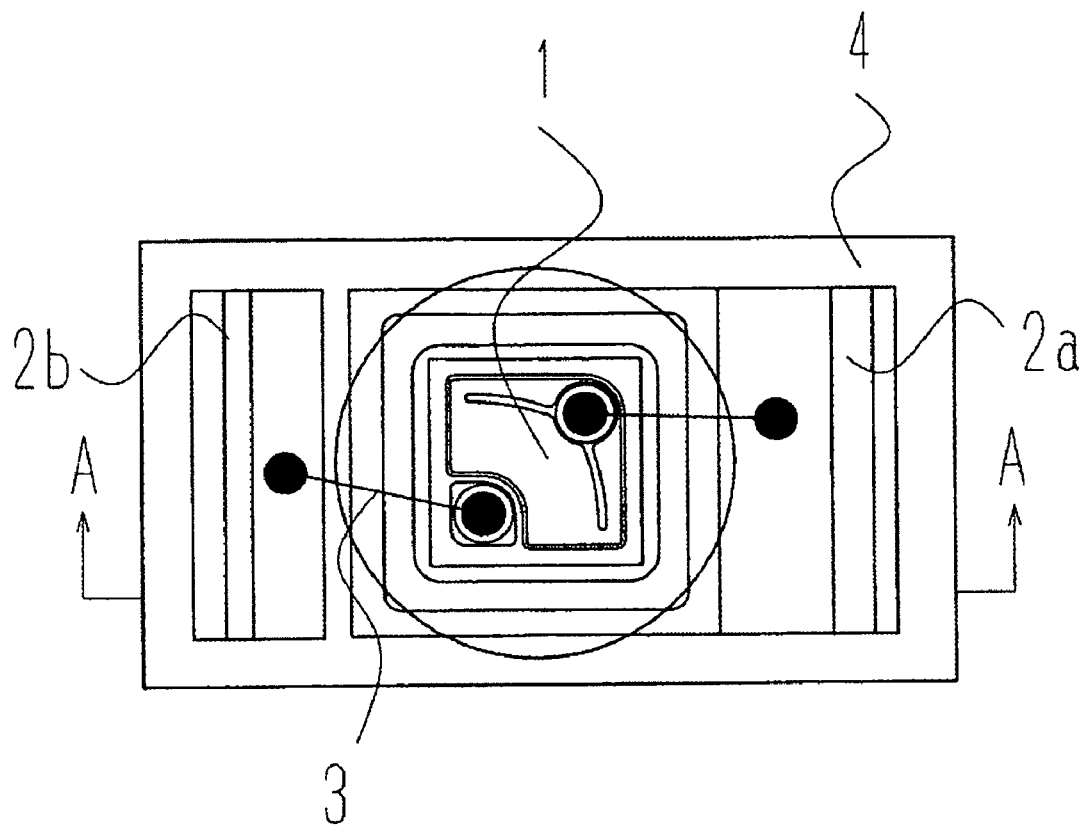
FIG. 3a is a simplified plan view of the light emitting device in an embodiment.
Figure 3B:
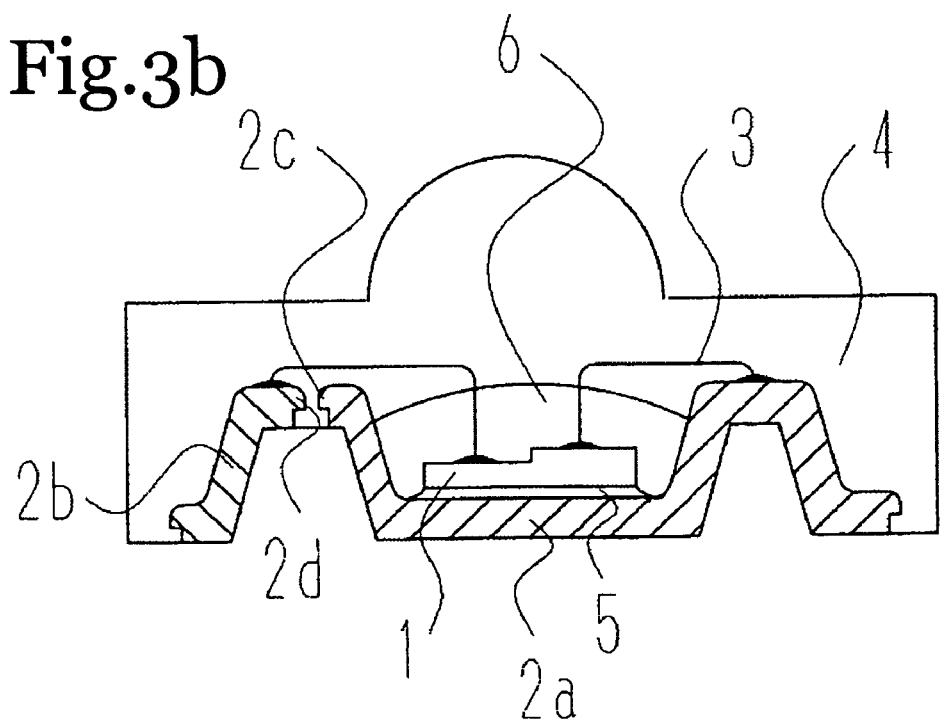

The light emitting device obtained in this manner was diced at the silicone resin portion around the outer periphery of the protrusions of the electroconductive layers to obtain the light emitting device with high light convergence shown in FIG. 3.

EXAMPLE 4

The electroconductive layers 2a and 2b were formed in the same manner as in Example 1, except that the resist was patterned so that openings measuring 0.5×0.2 mm were arranged in parallel at a pitch of 0.2 mm.

Next, the light emitting element 1 and the electroconductive layers 2a and 2b were flip-chip mounted via an anisotropic electroconductive member 7.

This anisotropic electroconductive member can be the product of forming a nickel thin film by electroless plating on the surface of plastic particles, then performing replacement plating with a gold thin film, and adding the resulting electroconductive particles in an amount of 5 vol % to a silicone resin. There are no particular restrictions on the material, as long as it contains electroconductive particles in an adhesive composed of an inorganic or organic material that is thermoplastic or thermosetting. It is particularly favorable to use electroconductive particles capable of efficiently reflecting light from the light emitting element 1. Specific examples of electroconductive particles that can be used include nickel particles, and particles or silica having a metal coating composed of nickel, gold, or the like on the surface thereof, or other such particles. The amount in which the electroconductive particles are contained is preferably from 0.3 to 12 vol % with respect to the adhesive, more preferably from 0.3 to 1.2 vol %. This allows conduction to be achieved easily by heating or pressing when the light emitting element 1 is put in place.

Figure 4A:
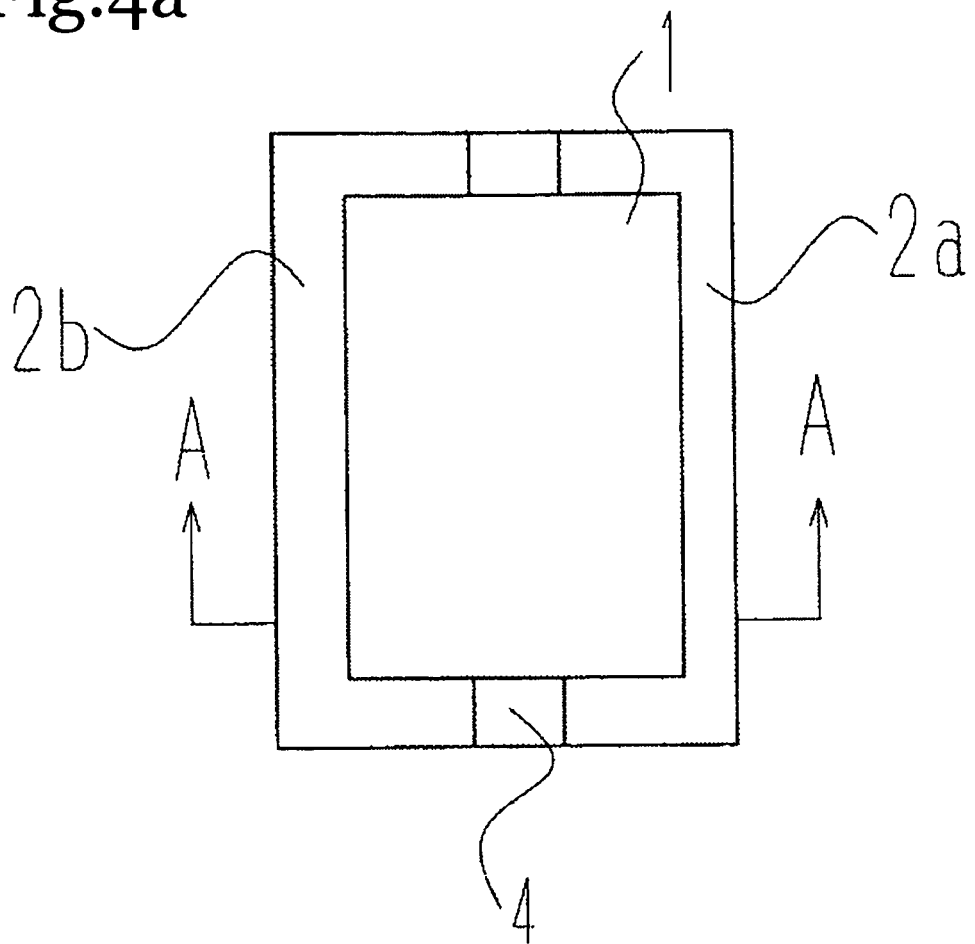
FIG. 4a is a simplified plan view of the light emitting device in an embodiment.
Figure 4B:
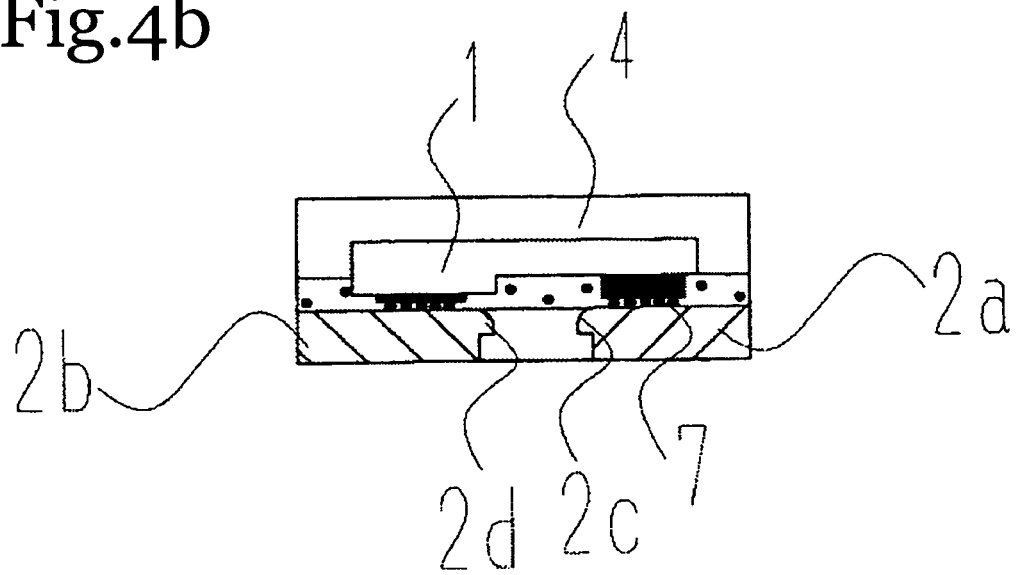

Finally, this product is diced in the center portion of the electroconductive layers to obtain the ultra-thin and compact light emitting device shown in FIGS. 4a and 4b.

The dicing line in the examples here can be selected according to the desired size of the light emitting device, involving either dicing the silicone resin portion at the outer periphery of the electroconductive layers as in Examples 1 to 3, or dicing over the electroconductive layers as in Example 4.

What is claimed is:

1. A light emitting device comprising
   first and second electroconductive layers with at least one of the first and second electroconductive layers including a light-reflecting electroconductive film formed on an upper face of the at least one of the electroconductive layers;
   a light emitting element mounted on the first electroconductive layer;
   a wire electrically connecting the light emitting element and the first electroconductive layer with the first electroconductive layer continuously extending between a portion where the light emitting element is mounted and a portion where the wire is connected; and
   a translucent insulating member made of resin material that seals the light emitting element and has the first and second electroconductive layers as its bottom surface, at least a part of the translucent insulating member containing a color conversion member,
   the first and second electroconductive layers having a protrusion on part of their side faces with the upper edge of the protrusion being rounded off.
2. The light emitting device according to claim 1, wherein the protrusion is on the upper face side of the first and second electroconductive layers.
3. The light emitting device according to claim 1, wherein the first electroconductive layer has a recess for holding the light emitting element, and has within said recess a color conversion member capable of converting the wavelength of light from the light emitting element.
4. The light emitting device according to claim 3, wherein the recess is on the upper face side of the first electroconductive layer.
5. The light emitting device according to claim 1, wherein the translucent insulating member covers the protrusion of the first and second electroconductive layers.
6. The light emitting device according to claim 1, wherein the at least one of the first and second electroconductive layers includes a nickel layer.
7. The light emitting device according to claim 6, wherein the nickel layer has a thickness that is smaller than a thickness obtained by subtracting a thickness of the protrusion from a total thickness of the at least one of the first and second electroconductive layers.
8. The light emitting device according to claim 1, wherein a spacing between the protrusions of the first and second electroconductive layers facing each other is from 50 μm to 1 mm.
9. The light emitting device according to claim 1, wherein a mounting surface of the light emitting element facing the first electroconductive layer is electrically insulated from the first electroconductive layer while the wire providing an electrical connection between the light emitting element and the first electroconductive layer.
10. The light emitting device according to claim 1, wherein the light emitting element is a gallium-nitride based compound semiconductor element having both positive and negative electrodes on the same side of the light emitting element.

* * * * *